(12) United States Patent  
Stockinger et al.

(10) Patent No.: US 6,970,336 B2  
(45) Date of Patent: Nov. 29, 2005

(54) ELECTROSTATIC DISCHARGE PROTECTION CIRCUIT AND METHOD OF OPERATION

(75) Inventors: Michael Stockinger, Austin, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 10/684,112

(22) Filed: Oct. 10, 2003

(65) Prior Publication Data

US 2005/0078419 A1 Apr. 14, 2005

(51) Int. Cl.[7] .............................. H02H 3/20; H02H 9/04
(52) U.S. Cl. .......................................... 361/56; 361/111
(58) Field of Search .......................... 361/56, 111, 91.1

(56) References Cited

U.S. PATENT DOCUMENTS

| | | | |
|---|---|---|---|
| 5,034,845 A * | 7/1991 | Murakami | 361/56 |
| 5,301,084 A * | 4/1994 | Miller | 361/56 |
| 5,654,862 A | 8/1997 | Worley | |
| 5,907,464 A | 5/1999 | Maloney | |
| 5,946,177 A | 8/1999 | Miller | |
| 5,956,219 A | 9/1999 | Maloney | |
| 6,385,021 B1 * | 5/2002 | Takeda et al. | 361/56 |
| 6,724,603 B2 * | 4/2004 | Miller et al. | 361/111 |

OTHER PUBLICATIONS

Worley et al, "Sub-Micron Chip ESD Protection Schemes Which Avoid Avalanching Junctions," EOS/ESD Symposium 1995, pp. 1.2.1-1.2.8.
Maloney et al., "Stacked PMOS Clamps for High Voltage Power Supply Protection," EOS/ESD Symposium 1999, pp. 2A.2.1-2A.2.8.
Poon et al., "New Considerations for MOSFET Power Clamps," EOS/ESD Symposium 2002, pp. 1A.1.1-1A.1.5.

\* cited by examiner

Primary Examiner—Brian Sircus
Assistant Examiner—F Rits
(74) Attorney, Agent, or Firm—Daniel D. Hill; David G. Dolezal

(57) ABSTRACT

An ESD protection circuit (201) is for use with a high-voltage tolerant I/O circuit in an IC. This is accomplished by providing a small ESD diode (217) from the I/O pad to a relatively small boosted voltage bus (BOOST BUS). The BOOST BUS is used to power a trigger circuit (203). This path has very little current flow during an ESD event due to minimal current dissipation in the trigger circuit. There is a diode drop but only very little IR voltage drop from the I/O pad to the trigger circuit (203). The trigger circuit (203) controls relatively large cascoded clamp NMOSFETs (207, 209). The net result is that a gate-to-source voltage (VGS) of both of the clamp NMOSFETs is increased thus increasing the conductivity of the cascoded clamp NMOSFETs (207, 209). This reduces the on-resistance of each of the NMOSFETS (207, 209), thereby improving the ESD performance, and reducing the layout area required to implement robust ESD protection circuits.

30 Claims, 3 Drawing Sheets

ELECTROSTATIC DISCHARGE PROTECTION CIRCUIT AND METHOD OF OPERATION

FIELD OF THE INVENTION

This invention relates generally to electrostatic discharge (ESD) protection for integrated circuits, and more specifically, to a high-voltage tolerant ESD protection circuit.

CROSS REFERENCE TO RELATED, COPENDING APPLICATIONS

A related, copending application is entitled "Electrostatic Discharge Protection Circuitry and Method of Operation", James W. Miller et al., application Ser. No. 10/216,336, is assigned to the assignee hereof, and filed on Aug. 9, 2002.

A related, copending application is entitled "Transient Detection Circuit", Michael Stockinger et al., application Ser. No. 10/315,796, is assigned to the assignee hereof, and filed on Dec. 10, 2002.

BACKGROUND OF THE INVENTION

An integrated circuit (IC) may be subject to an Electrostatic Discharge (ESD) event in the manufacturing process, during assembly and testing, or in the system application. In conventional IC ESD protection schemes, special clamp circuits are often used to shunt ESD current between the power supply buses and thereby protect internal elements from damage. However, some ICs allow voltages higher than the internal power supply voltage for a specific process technology to be brought on board the IC. ESD protection for this high-voltage node can be achieved with a stacked, or series connected active MOSFET clamp configuration as a shunting circuit between the high-voltage node and a ground bus.

FIG. 1 illustrates in schematic diagram form a prior art ESD protection circuit 101. ESD protection circuit 101 includes an ESD bus labeled "ESD BUS", an output buffer power supply bus labeled "VDD BUS", a ground bus labeled "VSS BUS", a trigger circuit 103, a shunting circuit 105, an input/output (I/O) pad 111, and diodes 113 and 115. It is assumed that during normal operation of the IC, the VDD BUS may be powered up to the maximum power supply voltage for a specific semiconductor process technology. This limit implies that no voltage higher than this maximum supply voltage may be applied across the gate oxide of any MOSFET (metal oxide semiconductor field effect transistor) in normal operation. In a typical high-voltage tolerant I/O application, the I/O pad may be driven externally to a voltage level up to twice as high as the maximum supply voltage. It is therefore assumed that, under normal operation, the ESD BUS may be maintained at the same high-voltage level since I/O pad 111 is coupled to the ESD BUS via diode 113. In an example IC application, the voltages on the VDD BUS and the ESD BUS may reach maximum voltages of 2.75 volts and 5.5 volts, respectively. Shunting circuit 105 includes cascoded NMOSFET rail clamp transistors 107 and 109. Trigger circuit 103 is coupled to the ESD BUS, the VDD BUS, and the VSS BUS. During normal operation of the IC, trigger circuit 103 provides a bias on the gate of transistor 107 equal to the voltage on the VDD BUS, and a bias on the gate of transistor 109 equal to the voltage on the VSS BUS, to insure that no voltage in excess of the maximum supply voltage is applied across the gate oxides of either transistor 107 or transistor 109. When an ESD event occurs, trigger circuit 103 provides a bias to the gates of both transistors 107 and 109 equal to the voltage on the ESD BUS local to these transistors. The I/O pad 111 is coupled to the ESD BUS and the VSS BUS via large ESD diodes 113 and 115, respectively. Diode 115 provides a high-current ESD path from the VSS BUS to I/O pad 111 in case of a negative ESD event on the I/O pad. When a positive ESD event with respect to VSS is applied to I/O pad 111, the intended high current path is from pad 111 through diode 113 to the ESD BUS and then through shunting circuit 105 to the VSS bus. During this ESD event, there may be a substantial IR voltage drop across diode 113 from I/O pad 111 to the ESD BUS, and along the ESD BUS between diode 113 and trigger circuit 103. Therefore, the gates of transistors 107 and 109 receive a relatively smaller bias voltage compared to the voltage at I/O pad 111, which effectively increases the on-resistance of transistors 107 and 109. To offset the higher on-resistance, large rail clamp transistors are typically used. However, the use of larger rail clamp transistors is undesirable because they require more chip area to implement. Therefore, there is a need for an ESD protection circuit that reduces the on-resistance of the ESD current path while minimizing the size of the ESD circuit.

BRIEF DESCRIPTION OF THE DRAWINGS

The present invention is illustrated by way of example and is not limited by the accompanying figures, in which like reference numbers indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides an ESD protection circuit for a high-voltage tolerant I/O circuit in an IC. This is accomplished by providing a path from the I/O pad to a trigger circuit separate from the intended high-current ESD path. This separate path includes a small ESD diode from the I/O pad to a relatively small boosted voltage bus (BOOST BUS). The BOOST BUS is used to power the trigger circuit during an ESD event. This path has very little current flow during an ESD event due to minimal current dissipation in the trigger circuit. The trigger circuit controls a shunting circuit having relatively large cascoded, or stacked, clamping NMOSFETs. The shunting circuit provides a discharge path from an ESD BUS to a VSS BUS. Due to the minimal current dissipation in the trigger circuit, there is only very little IR voltage drop in addition to a diode drop from the I/O pad to the BOOST BUS local to the I/O pad. Similarly, there is only very little IR voltage drop along the BOOST BUS from the I/O pad to the trigger circuit. The net result is that a gate-to-source voltage (VGS) of both of the cascoded clamp NMOSFETs is increased thus reducing the on-resistance of each shunting transistor. This improves the ESD performance, and reduces the layout area required to implement robust ESD protection circuits.

Figure 2:
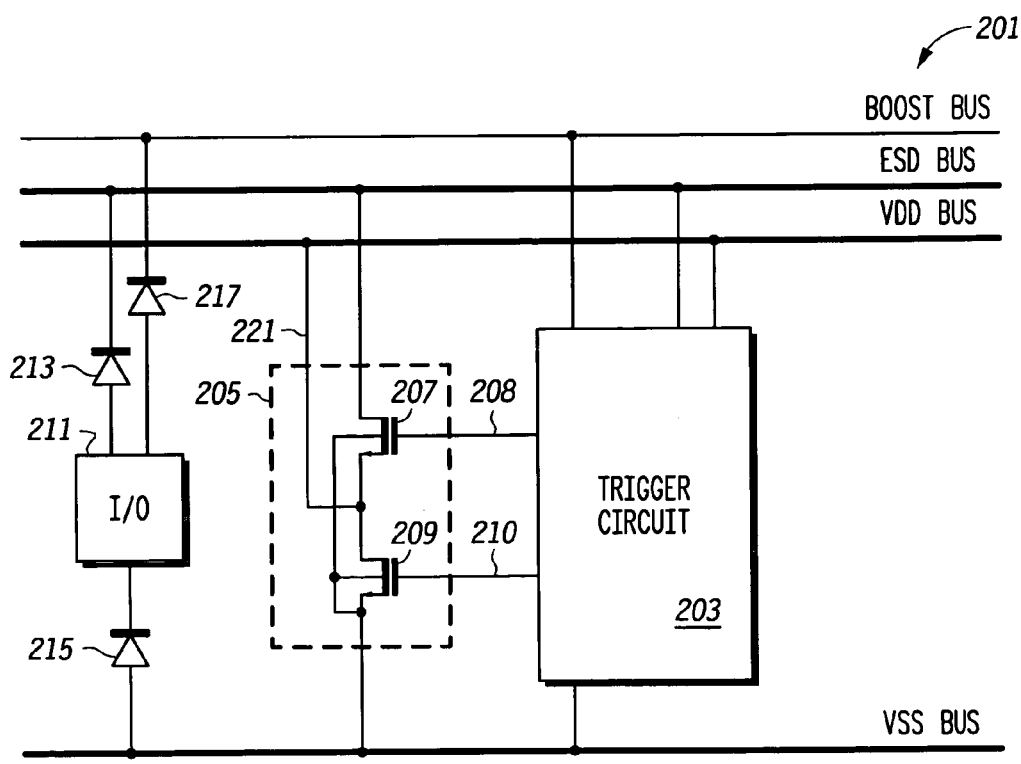
FIG. 2 illustrates in schematic diagram form an ESD protection circuit in accordance with the present invention.

FIG. 2 illustrates in schematic diagram form an ESD protection circuit 201 in accordance with the present invention. ESD protection circuit 201 includes diodes 213, 215, and 217, I/O pad 211, shunting circuit 205, and trigger circuit 203. Diode 213 is coupled between I/O pad 211 and an ESD bus labeled "ESD BUS". Diode 215 is coupled between I/O pad 211 and a ground bus labeled "VSS BUS". Diode 217 is coupled between I/O pad 211 and a boosted voltage bus labeled "BOOST BUS". In one embodiment, diodes 213 and 217 may be, for example, P+ active in an NWELL diodes, while diode 215 may be an N+ active in a PWELL diode. Diode 217 is relatively small compared to diodes 213 and 215. Shunting circuit 205 includes cascoded rail clamp transistors 207 and 209. Transistor 207 has a drain coupled to the ESD BUS, a gate, and a source. Transistor 209 has a drain coupled to the source of transistor 207, a gate, and a source coupled to the VSS BUS. In the illustrated embodiment, the source of transistor 207 and the drain of transistor 209 are coupled to a power supply bus labeled "VDD BUS" via an intermediate current terminal 221. During a positive ESD event (with respect to VSS), applied to the VDD BUS, intermediate current terminal 221 provides a direct ESD current shunting path between these two buses. Note that in other embodiments, intermediate current terminal 221 may be absent.

In one embodiment of ESD protection circuit 201, the ESD BUS may be a floating bus, internal to the IC, and not directly connected to any external pad on the IC. In other embodiments, the ESD bus may be directly connected to an external pad, for example, a 5.0 volt high-voltage power supply (HVDD) pad. In order to move the high currents associated with an ESD event, the ESD BUS, the VDD BUS, and the VSS BUS are typically substantially sized in order to minimize resistance and the resulting IR voltage drops along their length. The BOOST BUS may be sized much smaller, due to the much smaller currents typically coupled onto this bus, during an ESD event. The VSS BUS may also be coupled to a silicon substrate (not shown) of the IC to allow the substrate to conduct in parallel with the metal VSS BUS.

Trigger circuit 203 has a first input coupled to the BOOST BUS, a second input coupled to the ESD BUS, a third input coupled to the VDD BUS, and a fourth input coupled to the VSS BUS. The trigger circuit 203 has a first output 208 coupled to the gate of transistor 207 and a second output 210 coupled to the gate of transistor 209. During normal operation of the IC, trigger circuit 203 provides a bias on the gate of transistor 207 equal to the voltage on the VDD BUS, and a bias on the gate of transistor 209 equal to the voltage on the VSS BUS to insure that no voltage in excess of the maximum supply voltage is applied across the gate oxides of either transistor 207 or transistor 209. Under these bias conditions, there should be little or no MOSFET conduction through either of transistor 207 or 209. When an ESD event is detected, trigger circuit 203 provides a bias to the gates of transistors 207 and 209 equal to the voltage on the BOOST BUS and shunting circuit 205 provides a high-current path between the ESD BUS and the VSS BUS. Trigger circuit 203 will be discussed in more detail below with reference to FIG. 3.

Figure 1:
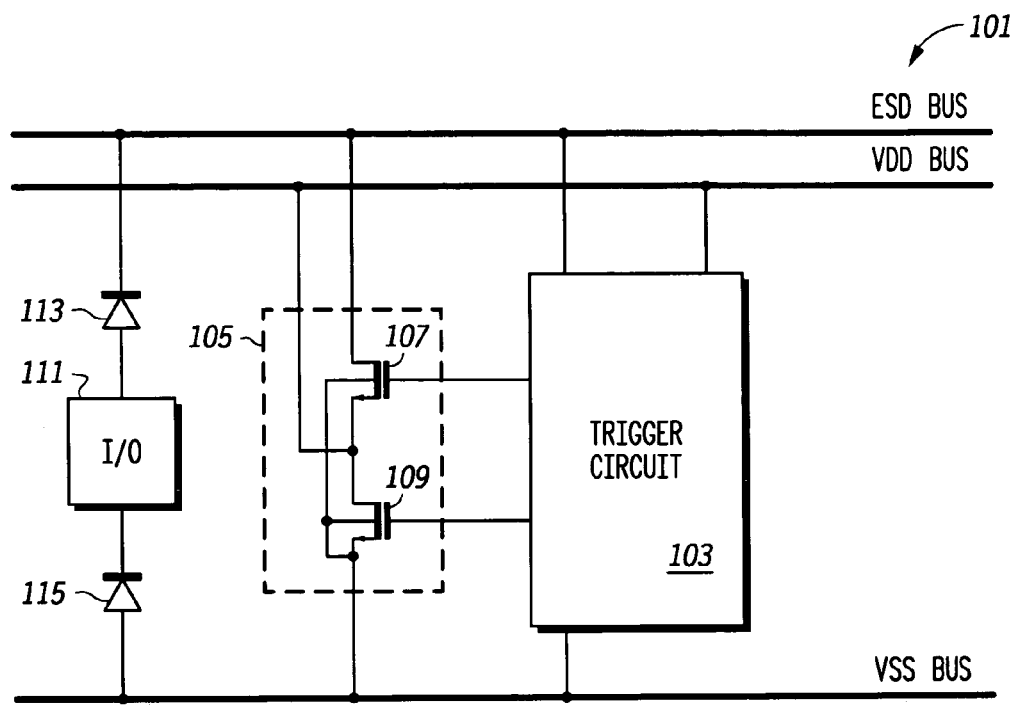
FIG. 1 illustrates in schematic diagram form a prior art ESD protection circuit.

When a positive ESD event with respect to VSS is applied to I/O pad 211, the intended high current ESD path is from pad 211 through diode 213 to the ESD BUS local to pad 211, and then along the ESD BUS to shunting circuit 205, then through shunting circuit 205 to the VSS BUS. During a typical ESD event, the peak ESD current between pad 211 and the VSS BUS may be 1 to 4 amperes. Due to this high current level there are typically substantial IR voltage drops across diode 213 and along the ESD BUS to the shunting circuit 205. For example, if the ESD BUS, the VSS BUS, diode 213, transistor 207 and transistor 209 are sized so that the I/O pad 211 voltage reaches 7 volts with respect to VSS during a 4 ampere peak current ESD event, the ESD bus local to shunting circuit 205 may reach 3.5 volts with respect to VSS, or half of the I/O pad 211 voltage. In the prior art circuit of FIG. 1, the trigger circuit would have applied this voltage (3.5 volts) to the gates of both transistors 207 and 209 in shunting circuit 205. With the addition of the BOOST BUS to power the trigger circuit 203, and with the diode 217 in FIG. 2, it is possible to apply a much larger fraction of the voltage at I/O pad 211 to the gates of transistors 207 and 209.

During an ESD event, trigger circuit 203 drives only the gates of transistors 207 and 209 and, as will be described in more detail below with reference to FIG. 3, draws very little current. Due to the very low current requirements of trigger circuit 203 during an ESD event, there are typically minimal IR voltage drops across diode 217 and along the BOOST BUS to the trigger circuit 203. Therefore, in the example cited above, with a voltage of 7 volts on I/O pad 211 with respect to VSS, a voltage of about 6 volts with respect to VSS may be seen on the BOOST BUS local to trigger circuit 203. Since trigger circuit 203 is powered by the BOOST BUS during an ESD event, the 6 volts will also be output onto the gates of transistors 207 and 209 by the trigger circuit.

By providing a path from I/O pad 211 to trigger circuit 203 separate from the intended high current ESD path, the gates of clamping transistors 207 and 209 are boosted above the local ESD BUS voltage. This is a significant improvement over the ESD protection circuit of FIG. 1. For fixed sizes of the cascoded clamp transistors, the boosted shunting circuit of FIG. 2 will exhibit less on-resistance between the ESD BUS and the VSS BUS than the shunting circuit of FIG. 1, due to the increased VGS (gate-source voltage) on both of the clamp transistors. This will reduce the voltage stress on the I/O pad during an ESD event. Alternately, assuming a fixed design target for the shunting circuit on-resistance, the boosted circuit of FIG. 2 will require smaller clamp transistor sizes to meet the target on-resistance, as compared to the circuit of FIG. 1.

While only one I/O pad 211 with its ESD protection diodes 213, 215, and 217 is shown in the ESD protection circuit 201 of FIG. 2, there is typically a plurality of I/O pads distributed along the BOOST BUS, VDD BUS, ESD BUS, and VSS BUS. If multiple I/O pads are present, trigger circuit 203 and shunting circuit 205 protect this plurality of I/O pads. In other embodiments, multiple trigger circuits 203 and shunting circuits 205 may be placed along the four buses to protect one or more I/O pads.

Figure 3:
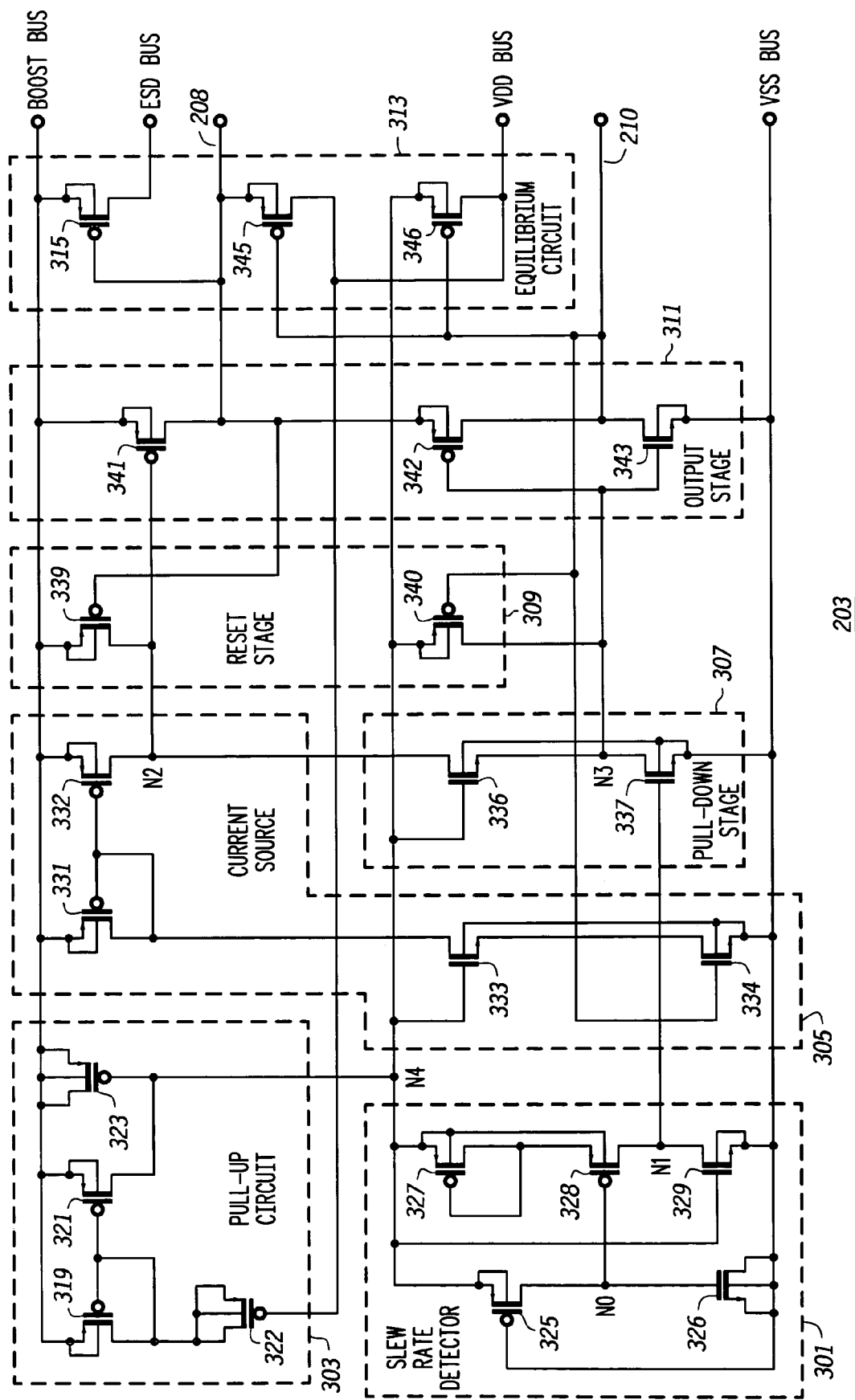
FIG. 3 illustrates in schematic diagram form an embodiment of a trigger circuit for use with the ESD protection circuit of FIG. 2.

FIG. 3 illustrates in schematic diagram form an embodiment of trigger circuit 203 of FIG. 2. Trigger circuit 203 includes a slew rate detector 301, a pull-up circuit 303, a current source 305, a pull-down stage 307, a reset stage 309, an output stage 311, and an equilibrium circuit 313. The transient trigger circuit 203 is used to control the gate voltages of NMOSFET 207 through output node 208 and NMOSFET 209 through output node 210. During normal, powered-up chip operation, output node 208 is coupled to the VDD BUS and node 210 is coupled to the VSS BUS, thereby switching off the rail clamp NMOSFETs 207 and 209. Biasing node 208 at the VDD BUS potential and node 210 at the VSS BUS potential insures that neither one of the gate oxides of NMOSFETs 207 and 209 is overstressed. That is, the stacked transistors 207 and 209 are not exposed to a voltage greater than the maximum supply voltage of the specific process technology used. During a detected transient ESD event, both nodes 208 and 210 are coupled to the BOOST BUS, thereby turning on the rail clamp NMOSFETs 207 and 209 and enabling shunting circuit 205 to conduct ESD current from the ESD BUS and the VDD BUS to the VSS BUS.

Trigger circuit 203 is primarily powered by the BOOST BUS and the VSS BUS; therefore trigger circuit 203 needs to be able to sustain a high-voltage level (higher than the maximum supply voltage level), which can occur on the BOOST BUS during normal operation in a high-voltage tolerant chip application as presented herein. This requires a circuit design that guarantees that, during normal chip operation, none of the MOSFET devices used in trigger circuit 203 are biased outside their allowed maximum operating voltage range, especially with respect to the voltage across their gate oxides.

Trigger circuit 203 includes an internal node N4 and a slew rate detector 301 connected to internal node N4. The slew rate detector includes an RC stage comprising PMOS resistor 325 and NMOS capacitor 326 and an inverter stage comprising PMOS resistor 327, PMOS driver transistor 328, and NMOS current source 329. During normal chip operation, the internal node N4 is coupled to the VDD BUS through PMOS 346 of equilibrium circuit 313. Because slew rate detector 301 is connected between internal node N4 and the VSS BUS, no high voltage stress can occur on any of the devices of slew rate detector 301. During a detected ESD event, internal node N4 is pulled up to the BOOST BUS voltage by pull-up circuit 303, which consists of a capacitive pull-up device comprising PMOS capacitor 323 and a conductive pull-up device comprising PMOS 321. The conductive pull-up device 321 supports the capacitive coupling through PMOS 323 during a voltage ramp on the BOOST BUS and is controlled by the output of an RC circuit comprising PMOS resistor 319 and PMOS capacitor 322. In other embodiments, either one of PMOS capacitor 323 or conductive pull-up device 321 may be absent from the circuit.

Slew rate detector 301 monitors the voltage on internal node N4 (and therefore indirectly the BOOST BUS voltage) for fast rising voltage ramps that are indicative of an ESD event. When an ESD event occurs, an RC node N0 is kept close to VSS by NMOS capacitor 326. This elevates the output node N1 of the slew rate detector above VSS by PMOS driver 328. Consequently, the pull-down stage 307 comprising cascoded NMOS devices 336 and 337 is activated and the nodes N2 and N3 are pulled down to VSS. This turns on the large PMOS transistors 341 and 342 in the output stage 311 and elevates the voltages on both output nodes 208 and 210 to the BOOST BUS voltage. Transistors 341 and 342 function as switches to provide a current path between the BOOST BUS and outputs 208 and 210, respectively.

The slew rate detector 301 shown in FIG. 3 provides only a short voltage pulse on the order of 10 nanoseconds to 20 nanoseconds on node N1. In order to achieve a reasonably long on-time of the trigger circuit (up to 1 microsecond or the maximum duration of an ESD event), the output stage remains switched-on even after node N1 falls back to VSS. This is accomplished by the large intrinsic gate capacitances of both PMOS devices 341 and 342 in output stage 311, which delay the voltage rise on nodes N2 and N3 after the detection of an ESD event. The charging current for these intrinsic gate capacitances is provided by current source 305. Current source 305 includes a cascoded NMOS stage comprising transistors 333 and 334 and a PMOS current mirror comprising transistors 331 and 332. The current source 305, which slowly charges up the intrinsic gate capacitances of PMOS 341 and 342 is only activated during an ESD event in order to avoid DC leakage current from the BOOST BUS to VSS. Once the voltage on both nodes N2 and N3 exceeds the switch point of an output stage inverter comprising PMOS transistor 342 and NMOS transistor 343, the trigger circuit output node 210 is set back to VSS and the output node 208 is set to VDD. This also activates the reset stage 309. Reset stage 309 includes PMOS transistors 339 and 340, which function to reset the voltage on node N2 to the BOOST BUS voltage and the voltage on node N3 to VDD to ensure that both PMOS transistors 341 and 342 in output stage 311 are fully turned off.

The equilibrium circuit 313 of FIG. 3 comprises three PMOS transistors 315, 345, and 346, which function to provide well-defined voltage levels on the BOOST BUS, the output node 208, and the internal node N4, respectively, during normal operation of the chip.

Figure 4:
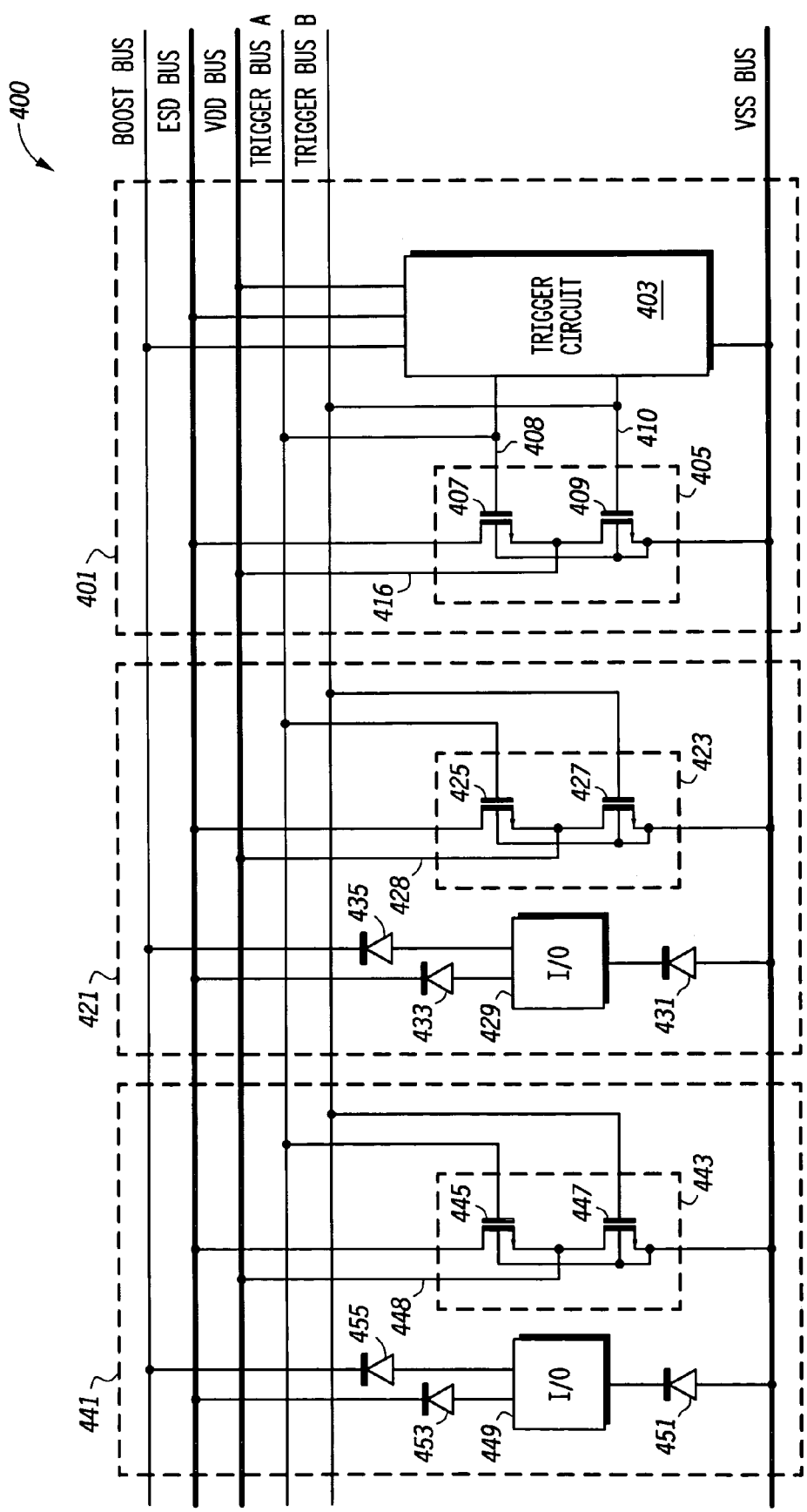
FIG. 4 illustrates in schematic diagram form a distributed ESD protection circuit in accordance with another embodiment of the present invention.

FIG. 4 illustrates in schematic diagram form a distributed ESD protection circuit 400 in accordance with another embodiment of the present invention. ESD protection circuit 400 includes a plurality of ESD pad cells as represented by ESD pad cells 421 and 441. Each ESD pad cell may be part of an I/O pad cell. The plurality of ESD pad cells is distributed across an IC as necessary to provide adequate ESD protection for a plurality of I/O pads. The ESD pad cell 421 includes shunting circuit 423, diodes 431, 433, and 435, and I/O pad 429. The ESD pad cell 441 includes shunting circuit 443, diodes 451, 453, and 455, and I/O pad 449. A clamping circuit 401 includes a trigger circuit 403 and a shunting circuit 405. The shunting circuit 405 includes cascoded clamping transistors 407 and 409, the shunting circuit 423 includes cascoded clamping transistors 425 and 427, and the shunting circuit 443 includes cascoded clamping transistors 445 and 447. In one embodiment, the trigger circuit 403 is similar to the trigger circuit 203 of FIG. 3 and is used to control the operation of the shunting circuits of each of the plurality of ESD pad cells. An output 408 of the trigger circuit 403 is coupled to the gate of transistor 407 and an output 410 is coupled to the gate of transistor 409. A trigger bus labeled "TRIGGER BUS A" is provided to couple the output 408 of the trigger circuit 403 to the gates of the transistors 425 and 445. A trigger bus labeled "TRIGGER BUS B" is provided to couple the output 410 to the gates of transistors 427 and 447. Note that only one trigger circuit 403 is illustrated in FIG. 4, however, in other embodiments, there may be more than one trigger circuit 403. In yet another embodiment trigger circuit 403 may be placed standalone, without clamping circuit 405, and its outputs 408 and 410 may connect only to TRIGGER BUS A and TRIGGER BUS B, respectively.

When a positive ESD event with respect to VSS is applied, for example to I/O pad 429, the intended high-current ESD path is from pad 429 through diode 433 to the ESD BUS local to pad 429, and then along the ESD BUS in both directions, and finally, through the multiple shunting circuits 443, 423, and 405 to the VSS BUS. Since the trigger circuit 403 draws very little current when enabled during an ESD event, there is almost no IR voltage drop across diode 435 and along the BOOST BUS between I/O pad 429 and the trigger circuit 403. Similarly, there are almost no IR voltage drops along TRIGGER BUS A and TRIGGER BUS B between trigger circuit 403 and shunting circuits 423 and 443. Therefore, trigger circuit 403 is able to drive the control electrodes of the multiple shunting devices to a voltage level generally greater than the peak voltage level on the ESD BUS.

Trigger circuit 403 drives the gates of clamp transistors in local shunting circuit 405 directly, and the gates of clamp transistors in remote shunting circuits 423 and 443 via TRIGGER BUS A and TRIGGER BUS B. It is an advantage of the distributed ESD protection circuit 400 that a single trigger circuit 403 may drive multiple remote shunting circuits. It would require significant additional layout area in ESD cells 421 and 441 to place separate trigger circuits to uniquely drive each shunting circuit. It is a further advantage that trigger circuits may be placed some distance from an I/O pad to be protected during ESD, due to the minimal IR drops along the BOOST BUS, TRIGGER BUS A and TRIGGER BUS B, between the I/O pad and the trigger circuit. During a positive ESD event (with respect to VSS), applied to the VDD BUS, intermediate current terminals 416, 428, 448 provide direct ESD current shunting paths between the VDD BUS and the VSS BUS. Note that in other embodiments, intermediate current terminals 416, 428, 448 may be absent.

By now it should be appreciated that there has been provided an ESD protection circuit and method that may be used for pad cell protection for all types of circuits. Also, the ESD protection circuits described herein are scalable to smaller processing geometries.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the transistors described herein may be implemented in any processing technology. For the MOS transistors illustrated, changing the conductivity type and the associated signaling logic are changes that are readily apparent. In certain situations, parasitic diodes that exist naturally may be used rather than implementing discrete diodes. Also, the physical positioning of the trigger circuits, pull-up circuitry and diodes within and around the pad cells may be varied from that illustrated without the functionality of the circuitry being affected. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms "including" and/or "having", as used herein, are defined as "comprising" (i.e., open language). The term "coupled", as used herein, is defined as connected, although not necessarily directly, and not necessarily mechanically.

What is claimed is:

1. An integrated circuit comprising:
a first bus;
a second bus;
a third bus;
a fourth bus;
a shunting circuit including a plurality of transistors in a stacked configuration, the shunting circuit having a plurality of control terminals, a first current terminal coupled to the first bus, a second current terminal coupled to the second bus, and an intermediate terminal coupled to the fourth bus, wherein the shunting circuit is made conductive to provide a discharge path from the first bus to the second bus for current from an electrostatic discharge (ESD) event;
a trigger circuit having a first output coupled to a first control terminal of the plurality of control terminals of the shunting circuit to provide a first control signal and having a second output coupled to a second control terminal of the plurality of control terminals of the shunting circuit to provide a second control signal, the trigger circuit is coupled to the third bus; and
a pad, the pad coupled to the first bus, the second bus, and the third bus.

2. The integrated circuit of claim 1 further comprising:
a pull-up device, the pad coupled to the third bus via the pull-up device.

3. The integrated circuit of claim 2 wherein the pull-up device includes a diode.

4. The integrated circuit of claim 1 wherein during a detection of an ESD event, the first output and the second output are pulled to substantially a voltage of the third bus to make conductive the shunting circuit to discharge current of the ESD event from the first bus to the second bus.

5. The integrated circuit of claim 1 wherein the trigger circuit further comprises a first switch and a second switch, wherein during the detection of an ESD event, the first switch and the second switch are made conductive to provide a current path between the third bus and the first output and between the third bus and the second output.

6. The integrated circuit of claim 1 wherein during a normal operation of the integrated circuit the first output is pulled substantially to a voltage of the fourth bus, and the second output is pulled substantially to a voltage of the second bus, wherein the voltage of the fourth bus is different than the voltage of the second bus.

7. The integrated circuit of claim 6 wherein:
the plurality of transistors are of a process technology having an associated maximum voltage, the first output being pulled substantially to the voltage of the fourth bus and the second output being pulled substantially to the voltage of the second bus places the transistors of the plurality in a state such that a voltage drop across each transistor of the plurality is less than the maximum voltage.

8. The integrated circuit of claim 1 wherein during a normal operation of the integrated circuit, the first output is at a first voltage, and the second output is at a second voltage, the first voltage is different from the second voltage.

9. The integrated circuit of claim 1 wherein during a normal operation of the integrated circuit, the trigger circuit provides a current path between the fourth bus and the first output and provides a second current path between the second bus and the second output.

10. The integrated circuit of claim 1 wherein:
the trigger circuit includes an internal node;
during a normal operation, the internal node is pulled substantially to a voltage of the fourth bus;
during a normal operation, the fourth bus is at a power supply voltage; and
during an ESD event, the internal node is pulled substantially to a voltage of the third bus.

11. The integrated circuit of claim 10 wherein:
the trigger circuit includes a pull-up circuit, wherein the pull-up circuit includes a capacitive pull-up device and/or a conductive pull-up device, wherein the internal node is coupled to the third bus via the capacitive pull-up device and/or the conductive pull-up device during an ESD event.

12. The integrated circuit of claim 11 wherein the conductive pull-up device is controlled by an output of an RC circuit.

13. The integrated circuit of claim 10, wherein the trigger circuit includes a detection circuit coupled to the internal node, the detection circuit detects an ESD event via the internal node.

14. The integrated circuit of claim 1 wherein the trigger circuit includes a slew rate detection circuit for detecting an ESD event.

15. The integrated circuit of claim 1 wherein the transistors of the plurality are MOSFETS.

16. The integrated circuit of claim 1 further comprising:
a second shunting circuit including a plurality of transistors in a stacked configuration, the second shunting circuit having a first current terminal coupled to the first bus and a second current terminal coupled to the second bus, wherein the second shunting circuit is made conductive to provide a discharge path from the first bus to the second bus for current from an ESD event;
wherein the first output is coupled to a first control terminal of the second shunting circuit to provide the first control signal and the second output is coupled to the second control terminal of the second shunting circuit to provide the second control signal.

17. The integrated circuit of claim 1 further comprising:
a fifth bus, the first control terminal coupled to the first output via the fifth bus; and
a sixth bus, the second control terminal coupled to the second output via the sixth bus.

18. The integrated circuit of claim 17 wherein:
the pad and the shunting circuit are located in an I/O cell;
the I/O cell includes a diode;
the pad is coupled to the third bus via the diode.

19. The integrated circuit of claim 17 wherein:
the shunting circuit is located in an I/O cell; and
the trigger circuit is located outside of the I/O cell.

20. The integrated circuit of claim 17 further comprising:
a plurality of shunting circuits coupled to a single trigger circuit.

21. The integrated circuit of claim 1 further comprising:
a second pad, the second pad is coupled to the first bus, the second bus, and the third bus.

22. The integrated circuit of claim 1 wherein:
the integrated circuit operates at a first supply voltage,
the pad is coupled to receive external signals at a second voltage, the second voltage being higher than the first voltage.

23. The integrated circuit of claim 1 further comprising:
the trigger circuit is implemented with a plurality at transistors of a process technology having an associated maximum voltage, wherein during normal operation, the third bus is at a higher voltage than the maximum voltage.

24. The integrated circuit of claim 1 wherein during an ESD event, the third bus is at a first voltage and the first bus is at a second voltage, the first voltage being higher than the second voltage.

25. A trigger circuit for an ESD protection circuit, the trigger circuit comprising:
a detection circuit coupled to a ground bus and to an internal node, the detection circuit for detecting an ESD event;
an internal node, the detection circuit detecting an ESD event via the internal node; and
a pull-up circuit coupled to the internal node, to a boosted voltage bus, and to a positive power supply voltage bus;
wherein during normal operation, the internal node is coupled to the positive power supply voltage bus; and
wherein during an ESD event, the internal node is coupled to the boosted voltage bus via a pull-up circuit, the boosted voltage bus being at a higher voltage than the positive power supply voltage bus during the ESD event.

26. The trigger circuit of claim 25 wherein during normal operation, the boosted voltage bus is at a greater voltage than the positive power supply voltage bus.

27. The trigger circuit of claim 26 wherein the pull-up circuit includes a capacitive pull-up device and/or a conductive pull-up device, wherein the internal node is coupled to the boosted voltage bus via the capacitive pull-up device and/or the conductive pull-up device during the ESD event.

28. The trigger circuit of claim 25 further comprising:
a first output; and
a second output;
wherein during an ESD event, the trigger circuit providing at the first output and the second output, the boosted voltage; and
wherein during normal operation, the trigger circuit providing the positive power supply voltage at the first output while the second output is coupled to ground.

29. A method of operating an (electrostatic discharge) ESD circuit, the method comprising:
providing, in response to detecting an ESD event, a first control signal and a second control signal at a voltage substantially equal to a voltage of a boosted voltage bus of an integrated circuit to a first control terminal and a second control terminal, respectively, of a shunting circuit, wherein the first control signal and the second control signal being at the voltage makes conductive the shunting circuit to discharge current of the ESD event from an ESD bus to a ground bus; and
providing, during a normal operation of an integrated circuit, the first control signal at a positive power supply voltage and the second control signal at ground, wherein the voltage of the boosted voltage bus is higher than the positive power supply voltage during the ESD event.

30. The method of claim 29 wherein the shunting circuit comprises first and second cascoded transistors coupled between the ESD bus and the ground bus.

* * * * *

UNITED STATES PATENT AND TRADEMARK OFFICE
CERTIFICATE OF CORRECTION

PATENT NO.         : 6,970,336 B2  
APPLICATION NO. : 10/684112  
DATED                 : October 10, 2003  
INVENTOR(S)        : Michael Stockinger Page 1 of 1

It is certified that error appears in the above-identified patent and that said Letters Patent is hereby corrected as shown below:

In Column 8, Line 46, Claim No. 5:
   Change "fuither" to --further--

In Column 8, Line 52, Claim No. 6:
   Change "integrated circuit the first" to --integrated circuit, the first--

In Column 10, Line 7, Claim No. 23:
   Change "with a plurality at" to --with a plurality of--

Signed and Sealed this

Twenty-seventh Day of May, 2008

JON W. DUDAS  
*Director of the United States Patent and Trademark Office*

UNITED STATES PATENT AND TRADEMARK OFFICE
CERTIFICATE OF CORRECTION

PATENT NO. : 6,970,336 B2
APPLICATION NO. : 10/684112
DATED : November 29, 2005
INVENTOR(S) : Michael Stockinger Page 1 of 1

It is certified that error appears in the above-identified patent and that said Letters Patent is hereby corrected as shown below:

In Column 8, Line 46, Claim No. 5:
    Change "fuither" to --further--

In Column 8, Line 52, Claim No. 6:
    Change "integrated circuit the first" to --integrated circuit, the first--

In Column 10, Line 7, Claim No. 23:
    Change "with a plurality at" to --with a plurality of--

This certificate supersedes the Certificate of Correction issued May 27, 2008.

Signed and Sealed this

Twenty-fourth Day of June, 2008

JON W. DUDAS
*Director of the United States Patent and Trademark Office*